United States Patent [19]

Werner, Jr.

[11] Patent Number: 5,212,451
[45] Date of Patent: May 18, 1993

[54] SINGLE BALANCED BEAM ELECTROSTATIC VOLTMETER MODULATOR

[75] Inventor: Alan J. Werner, Jr., Rochester, N.Y.

[73] Assignee: Xerox Corporation, Stamford, Conn.

[21] Appl. No.: 848,563

[22] Filed: Mar. 9, 1992

[51] Int. Cl.⁵ ............................................. G01R 29/12
[52] U.S. Cl. ..................................... 324/458; 324/72.5
[58] Field of Search ................. 324/72, 72.5, 458, 457

[56] References Cited

U.S. PATENT DOCUMENTS

| | | | |
|---|---|---|---|
| 3,852,667 | 12/1974 | Williams et al. | 324/72 |
| 3,921,087 | 11/1975 | Vasteen | 330/2 |
| 4,149,119 | 4/1979 | Buchheit | 324/32 |
| 4,318,042 | 3/1982 | Eda et al. | 324/72.5 |
| 4,614,908 | 9/1986 | Daniele et al. | 324/458 |
| 4,625,176 | 11/1986 | Champion et al. | 324/458 |
| 4,649,336 | 3/1987 | Binder et al. | 324/458 X |
| 4,720,682 | 1/1988 | Ikushima et al. | 324/458 |
| 4,763,078 | 8/1988 | Williams | 324/458 |

*Primary Examiner*—Jack B. Harvey
*Attorney, Agent, or Firm*—Duane C. Basch

[57] ABSTRACT

An electrostatic measurement apparatus having a single balanced beam vibratory element supported and balanced at its center, so that it may be driven in a manner to cause a regular vibration of the beam. The apparatus also has an electrode suitable for sensing a capacitive coupling relationship with an electrostatic field to produce a signal indicative of the magnitude of the electrostatic field. The coupling of the electrode with the electrostatic field is modulated (coupled/decoupled) either by attaching the electrode to the end of the beam and vibrating the electrode past an aperture, or by affixing a vane to the end of the beam, whereupon the vibration of the beam causes the vane to occlude the electrode from capacitively coupling with the electrostatic field.

13 Claims, 4 Drawing Sheets

SINGLE BALANCED BEAM ELECTROSTATIC VOLTMETER MODULATOR

BACKGROUND AND SUMMARY OF THE INVENTION

This invention relates generally to the measurement of electrostatic potentials, and more particularly to an apparatus for achieving the modulation of a sensor or electrode used to measure an electrostatic field or electrostatic voltage.

The electrostatic voltmeter which includes the present invention is a device capable of measuring electrostatic fields or potential without current flow through the device. Generally, these devices include a probe or sensor assembly working in conjunction with an associated voltmeter assembly which receives the signals from the probe and produces an output signal. Subsequently, the output signal may be used to drive an indicator, or to control an electrostatic process as a function of the measured electrostatic potential. Thus, the features of the present invention may be used in the printing arts and, more particularly, in an electroreprographic system to control a xerographic process. These electrostatic voltmeters are particularly well suited for measuring photoreceptor surface charge, which in turn allows for the automated adjustment of machine characteristics to achieve high quality reprographic output.

Heretofore, it has been established that a sensing electrode must be modulated with respect to the field being measured in order to accurately measure the field. Essentially, two methods of achieving the required modulation of the electrode are known. The first method requires that the electrode be stationary and that a vibrating element, or vane, be moved between a viewing port and the electrode itself to modulate the field which reaches the electrode. The second method utilizes a moving electrode which is vibrated relative to the surface being measured. Two embodiments of this method are commonly used. A first embodiment moves the electrode in a direction perpendicular to the surface being measured thereby directly varying the capacitance between the electrode and the surface. The second embodiment utilizes an aperture, placed between the electrode and the surface under test, to periodically capacitively couple the electrode and the surface through the aperture as the electrode is moved parallel to the surface. This may be done by affixing the electrode to the end of a vibrating device such as the tine of a tuning fork. An advantage of the second embodiment is that if the electrode is generally centered on the aperture, the motion of the electrode will decouple it from the surface twice during every vibration cycle, effectively doubling the frequency of the modulation as compared to the frequency of the vibrating system. Generally, both the first and the second embodiments utilize a tuning fork to reliably achieve the modulation of the electrode, either by a vane attached to one end of the fork, or by affixing the electrode directly to an end of the fork.

The approaches devised to vibrate the electrode in an electrostatic field in order to measure the electrostatic surface potential, are illustrated in the following disclosures which may be relevant:

U.S. Pat. No. 4,763,078, patentee: Williams, issued: Aug. 9, 1988;

U.S. Pat. No. 4,720,682, patentee: Ikushima et al. issued: Jan. 19, 1988;

U.S. Pat. No. 4,625,176, patentee: Champion et al. issued: Nov. 25, 1986;

U.S. Pat. No. 4,614,908, patentee: Daniele et al. issued: Sep. 30, 1986;

U.S. Pat. No. 4,318,042, patentee: Eda et al.; issued: Mar. 2, 1982;

U.S. Pat. No. 4,149,119, patentee: Buchheit, issued: Apr. 10, 1979;

U.S. Pat. No. 3,921,087, patentee: Vosteen, issued: Nov. 18, 1975;

U.S. Pat. No. 3,852,667, patentee: Williams et al., issued: Dec. 3, 1974.

The relevant portions of the foregoing patents may be briefly summarized as follows:

U.S. Pat. No. 4,763,078 to Williams relates to a sensor for an electrostatic voltmeter which consists of a vibratory element supported on one end in the manner of a cantilever beam, a sensitive electrode on the vibratory element for measuring the potential, a driver for vibrating the vibratory element in a direction to vary the capacitive coupling between the electrode and the electrical field being measured, and an amplifier mounted directly on the vibratory element so as to be in synchronous motion with the electrode. When the vibrating element is at rest, it is disposed in a plane substantially parallel to the plane of a base plate.

U.S. Pat. No. 4,720,682 to Ikushima et al. discloses a surface electric potential sensor for detecting the potential on a surface in a non-contacting fashion. The sensor consists of a tuning fork, a piezoelectric vibration element mounted on each leg of the tuning fork, at a position near a base of the tuning fork, for vibrating the tuning fork, an insulating substrate mounted on a free end of each leg of the tuning fork, a conductive film provided on the insulating substrate, a board for supporting the tuning fork, and a shield case for encasing the tuning fork.

U.S. Pat. No. 4,625,176 to Champion et al. describes a vibrating probe for measuring electrostatic potential associated with electrophotographic copiers and print machines. The probe is made from a single piezoceramic bender element surrounded by a shield at a known potential. The bender element is comprised of a piezoceramic drive layer connected to a drive oscillator, a sensing conductor, and a piezoceramic feedback layer which is also connected to the drive oscillator. This system provides a simple electrostatic probe comprised of a single bender element which acts as a drive element, a sensor element, and a feedback element in one.

U.S. Pat. No. 4,614,908 to Daniele et al. relates to a probe for electrostatic voltmeters which measures the voltage on a photoconductive surface. The probe consists of a microdeflector which includes a base having a well and a flexible finger on the base, positioned over the well. The finger is able to deflect relative to the base. The finger further includes an inner electrode and an outer electrode.

U.S. Pat. No. 4,318,042 to Eda et al. relates to an electrometer probe for measuring the electrostatic potential on the surface of a photoconductive drum, in an electrostatic machine. The probe includes an electrode which is in the form of a strip.

U.S. Pat. No. 4,149,119 to Buchheit teaches an electrostatic voltmeter or electrometer which includes a probe sensor for sensing electrostatic charge present on a test surface. The probe sensor is modulated using a rotating vane or shutter arrangement. The probe is also conditioned to receive both A.C. and D.C. signals which are amplified by a D.C. amplifier, where the A.C. signal from the probe is fed back to the D.C. amplifier to stabilize its output.

U.S. Pat. No. 3,921,087 to Vosteen discloses a capacitive electrostatic modulator for an electrostatic voltmeter. The modulator includes tines, or vanes, operatively associated with each of the ends of the tuning fork and placed between a sensitive electrode and the source of the electrostatic field being measured. A driver is used to vibrate the tuning fork, and thus the vanes, thereby alternatively coupling and decoupling the electrode with the electrostatic field, and producing a voltage corresponding to the magnitude of the field. Associated circuitry is used to connect the electrostatic modulator to a voltmeter or field meter.

U.S. Pat. No. 3,852,667 to Williams et al. relates to a probe or sensor for an electrostatic voltmeter including a voltage sensitive electrode which is vibrated within a housing so as to vary the amount of the surface of the electrode which is directly exposed to an external electrical potential through an aperture in the housing. The electrode is connected to one tine of a tuning fork which is vibrated when a driving signal is applied to a piezoelectric transducer on the fork. An electrical conductor, which connects the electrode to the voltmeter circuitry, is provided with an electrically driven shield, and a reference potential is applied to the housing to enhance the accuracy of the signal generated by the electrode.

An object of the present invention is to provide a single balanced beam electrode modulator capable of modulating the field to which an electrostatic electrode is coupled. The balanced beam structure results in a simple configuration which enables a compact design and the physical separation of the vibratory drive signal and the sensed signal produced by the electrode. Likewise, the error in the sensor signal, caused by coupling between the power signal supplied to the vibratory driver and the electrode signal, may also be reduced.

In accordance with the present invention, there is provided an electrostatic measurement apparatus having a single balanced beam vibratory element which is resiliently supported. The apparatus also includes a driver for vibrating the single balanced beam element. The single balanced beam element has an electrode, operatively associated therewith, suitable for sensing a capacitive coupling relationship with an electrostatic field, whereby the vibration of the single balanced beam vibratory element results in the modulation of the capacitive coupling relationship between the electrode and the electrostatic field.

The present invention will be described in connection with multiple embodiments. However, it will be understood that there is no intent to limit the invention to these embodiments. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
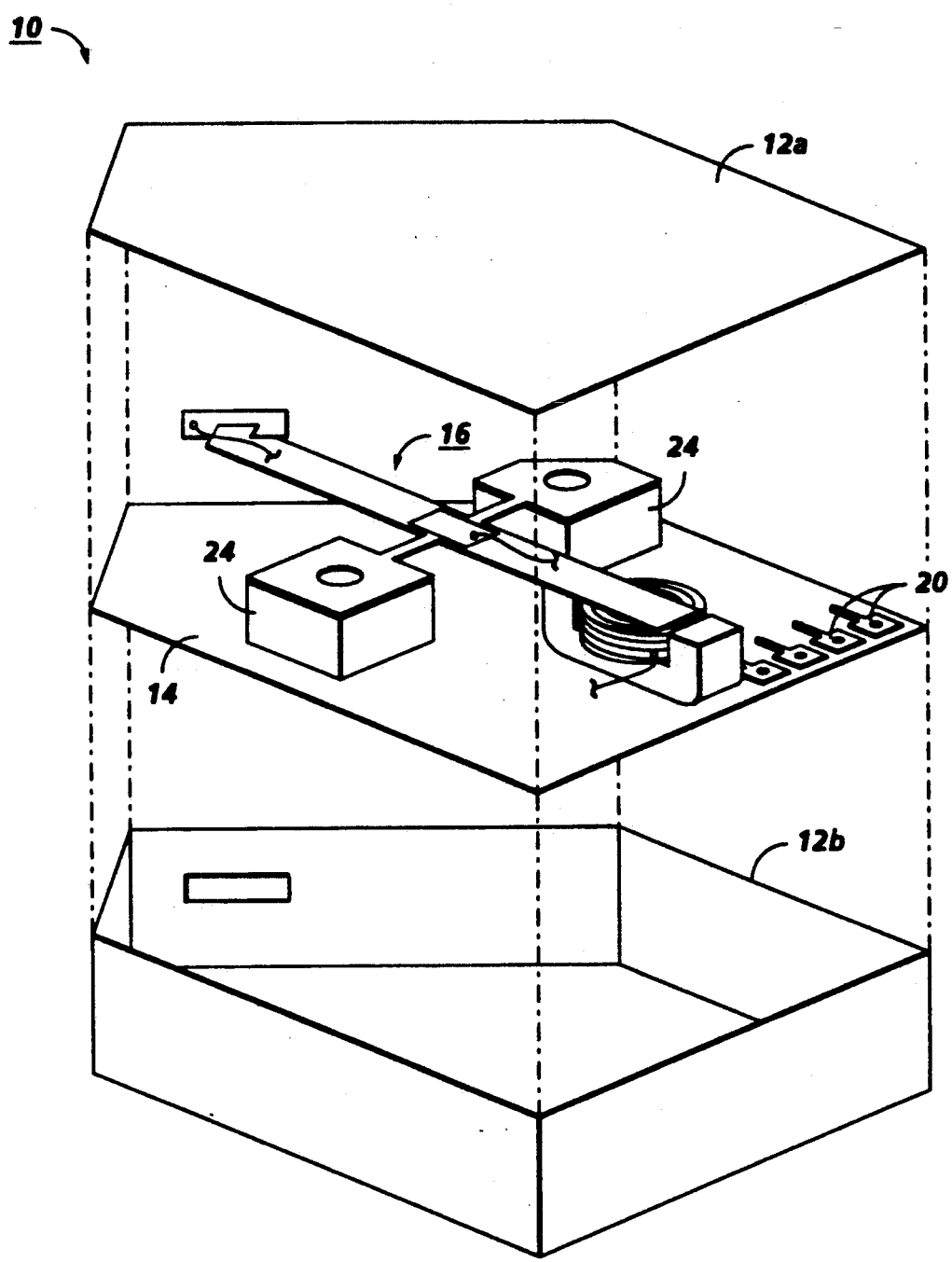
FIG. 1 is a perspective view of an embodiment of the modulated sensor assembly of the present invention.

For a general understanding of the single balanced beam modulator of the present invention, reference is made to the drawings. In the drawings, like reference numerals have been used throughout to designate identical elements. FIG. 1 shows a sensor, 10, which may be used in an electrostatic voltmeter (ESV). Sensor 10 includes a housing having top 12a and sides 12b, a rigid substrate 14, and a modulator assembly 16, all of which are assembled as illustrated to form the complete sensor package. While not shown, the sensor may also include additional electrical components necessary for amplifying or filtering the signals produced by various elements of modulator assembly 16. In addition, substrate 14 is generally a substrate suitable for the patterning of electrical circuits thereon, and may further include pads 20 which provide solderable electrical contacts for a suitable multi-wire cable (not shown). Once connected to sensor 10, the multi-wire cable would provide paths for incoming power used by the elements of the modulator, as well as the output signals which are transmitted back to a receiving station (not shown) on the other end of the cable. The receiving station may include any commonly known circuit for the capture and/or characterization of the signals produced by sensor 10. Suitable electrostatic voltmeter circuitry is described in U.S. Pat. No. 3,852,667 to Williams, or U.S. Pat. No. 3,921,087 to Vosteen, the relevant portions of both of which are hereby incorporated by reference.

Figure 2A:
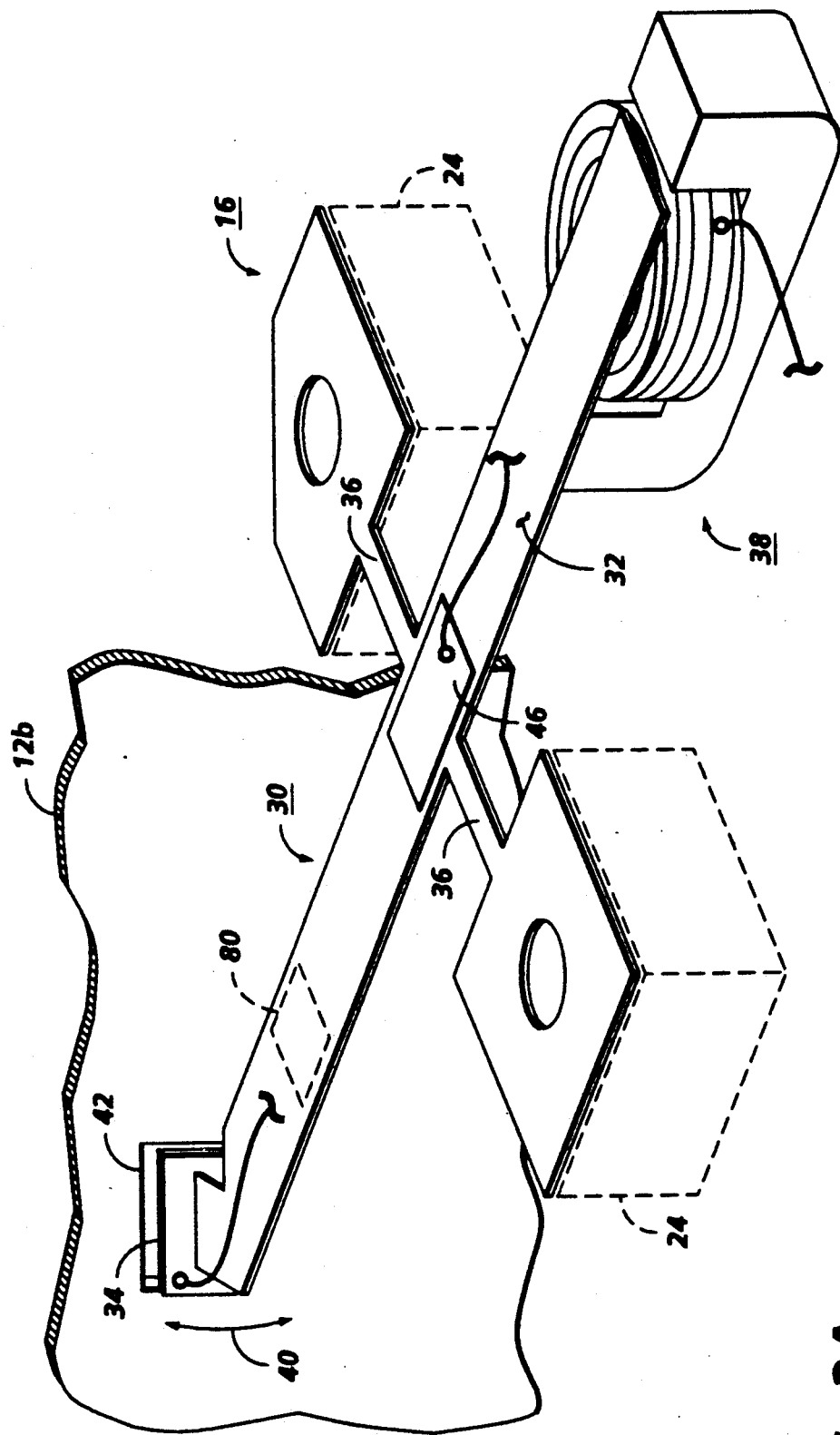
FIG. 2A is an enlarged perspective view of the single balanced beam vibratory element of FIG. 1, where a sensor element is affixed to one end of the vibratory element.

Referring also to FIG. 2A, where modulator assembly 16 is shown in greater detail, the assembly includes a one-piece vibration element, 30, which is rigidly affixed to substrate 14 via mounting blocks, or standoffs, 24. Vibration element 30 includes a longitudinal beam 32 having sensor electrode 34 permanently affixed to one end thereof, and resilient supports 36 located near the midpoint of the beam to support the beam yet allow oscillation or bending of the ends of the beam. Sensor electrode 34 may be any commonly known sensor element suitable for capacitively coupling with an electrostatic field external to housing 12, and thereby producing a signal indicative of the magnitude of said electrostatic field. The signal produced by sensor electrode 34 may be amplified by amplifier 80 so as to produce a signal suitable for transmission to an external voltmeter. Also, amplifier 80 may be positioned on beam 32 so as to reduce the cross-coupling of the signal generated by the electrode with other extraneous signals. A suitable amplifier arrangement is further described by Williams in U.S. Pat. No. 4,763,078, the relevant portions of which are hereby incorporated by reference.

The characteristic dimensions of beam 32, preferably made of Ni-Span-C ® (a Nickel-Iron-Chromium alloy, available from the International Nickel Co., Inc.), and the location of supports 36 operate to define where the vibrational node and center of vibration of the beam will lie. While numerous materials may be used, those that are commonly used for the production of vibrational references, for example, tuning forks, exhibit the required mechanical characteristics. Moreover, the present embodiment employs a vibrating member made of a material having a high magnetic permeability so that it will be responsive to an applied magnetic field. Therefore, when beam 30 is induced to vibrate under the influence of magnetic coil 38, located beneath the end of the beam opposite the sensor element, sensor electrode 34 will be oscillated in the direction indicated by arrows 40. During the oscillations, the electrode is repeatedly coupled and decoupled to an electrostatic field as it passes aperture 42, located in a side wall of housing 12b, at a location proximate the resting or nominal position of the sensor electrode. In other words, when beam 32 is vibrated, the resulting motion causes sensor electrode 34 to swing back-and-forth across aperture 42. The oscillation of the sensor electrode causes it to be exposed to an external electrical field passing through the aperture whenever it passes its resting position. Thus, the sensor electrode is exposed twice during each vibratory cycle of the beam and the remainder of the time it is partially or fully occluded by the walls, 12b, of the housing, thereby producing a modulation frequency that is double the vibrational frequency of beam 32. As an alternative, sensor electrode 34 may also be positioned, with respect to aperture 42, so that the frequency is not doubled, but remains equal to the vibrational frequency of beam 32.

As previously mentioned, the oscillation of beam 32 is directly influenced by magnetic coil 38, which acts as a driver for the one-piece vibration element. Piezoelectric pickup, 46, located across the vibrational node of beam 32, senses the vibrations of the beam, and provides signals to a feedback control circuit (not shown) so as to control the drive signal supplied to the magnetic coil and, thus, the frequency and mode of the beam vibrations. More specifically, the feedback control regulates the frequency of the AC voltage applied to magnetic coil 38 so as to achieve the desired harmonic vibration of the beam. In one embodiment, a beam having a total length of about 25 millimeters and a width of about two millimeters maintains a vibrational amplitude, measured at the end of the beam, of approximately 1 millimeter peak-to-peak at a frequency of about 1 kilohertz (kHz).

At the harmonic frequency of the beam, the energy required to maintain the vibration is minimized, resulting in additional efficiency and lower driving current for the magnetic coil. Moreover, the dynamics of the single balanced beam design result in a sharper resonance curve, or higher Q, for the modulator. The higher Q factor in turn reflects a lower rate of decay for damped free vibration when compared to sensors which employ cantilever modulation means. Because of the efficiency of the single balanced beam modulator, low driving current is required to modulate the sensor element, resulting in the further reduction of the sensor error caused by the cross-coupling of the drive signal with the signal produced by sensor element 34. Furthermore, the height of sides 12b is reduced, as compared to the available tuning fork modulators, because the necessary clearance for the single balanced beam is about one-half that of a tuning fork. Therefore, the reduced size of sensor 10 will allow it to be used in equipment having limited space for access to the surface for which the electrostatic charge is to be measured.

The embodiment depicted in FIG. 2A indicates that piezoelectric pickup 46, which may be any suitable film-type element producing an electrical response to a deflection thereof, is used to monitor the vibration of beam 32, and magnetic coil 38 is used to drive the vibration of the beam. Alternatively, these two operations may be accomplished by, for example, replacing magnetic coil 38 with a second piezoelectric element placed on the underside of the beam, near the center, to drive the beam in response to the electrical drive signals supplied thereto. Conversely, a pair of magnetic coils may be positioned at opposite ends of the beam, one being used to drive the beam and the other being used to sense the vibration of the beam and provide the feedback necessary to control the vibration. Accordingly, the scope of the present invention is intended to include all such alternative methods of driving and monitoring the beam vibration.

Figure 2B:
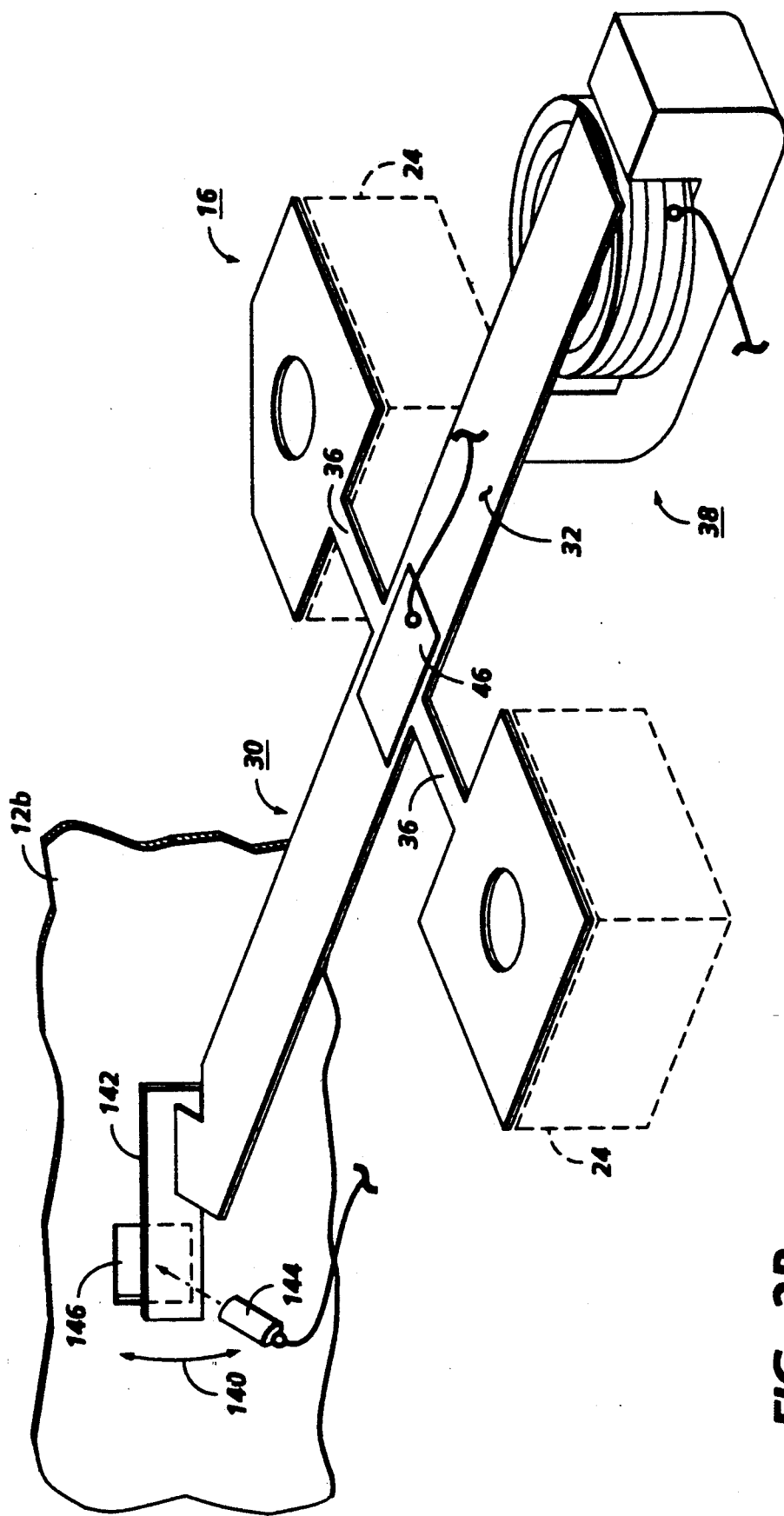
FIG. 2B is an enlarged perspective view of the single balanced beam vibratory element of FIG. 1 having a fixed sensor element and a vane attached to one end of the vibratory element in accordance with an alternate embodiment.

Referring now to FIG. 2B, where an alternative sensor embodiment is displayed in detail, beam 32 has vane 142 attached to one end thereof. When beam 32 is vibrated, vane 142 moves in the direction indicated by arrows 140, thereby periodically occluding the direct coupling of sensor electrode 144 to the electric field passing through aperture 146. Thus, the illustrated embodiment utilizes a stationary sensor electrode, 144, and achieves the modulation of the electrode by obstructing the electric field with vane 142. As in the embodiment of FIG. 2A, the inherent advantages of the single balanced beam modulator are again present, resulting in an efficient mechanical system, simple frequency doubling, higher operating frequencies, and more accurate measurement of the electrostatic field characteristics.

Figure 3A:
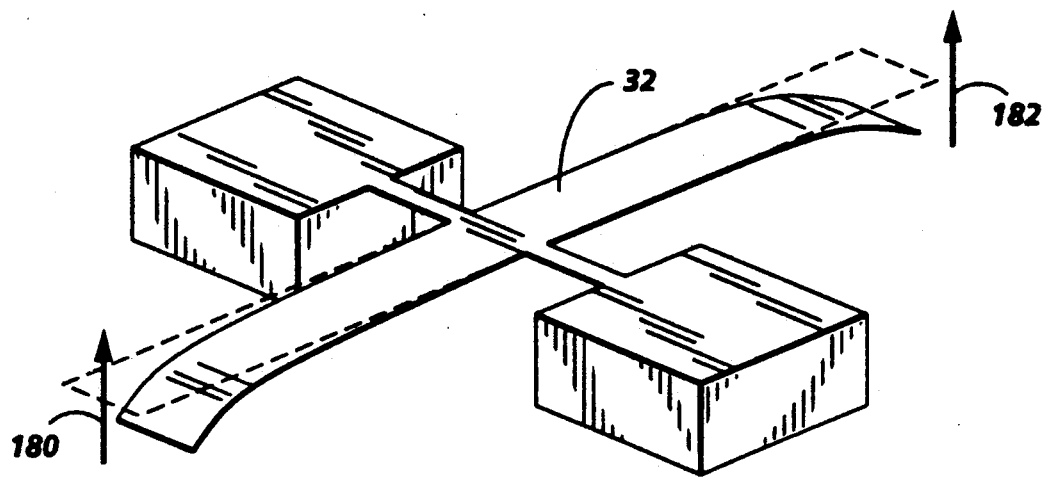
FIGS. 3A and 3B depict two illustrative bending modes for the vibratory element of the present invention.
Figure 3B:
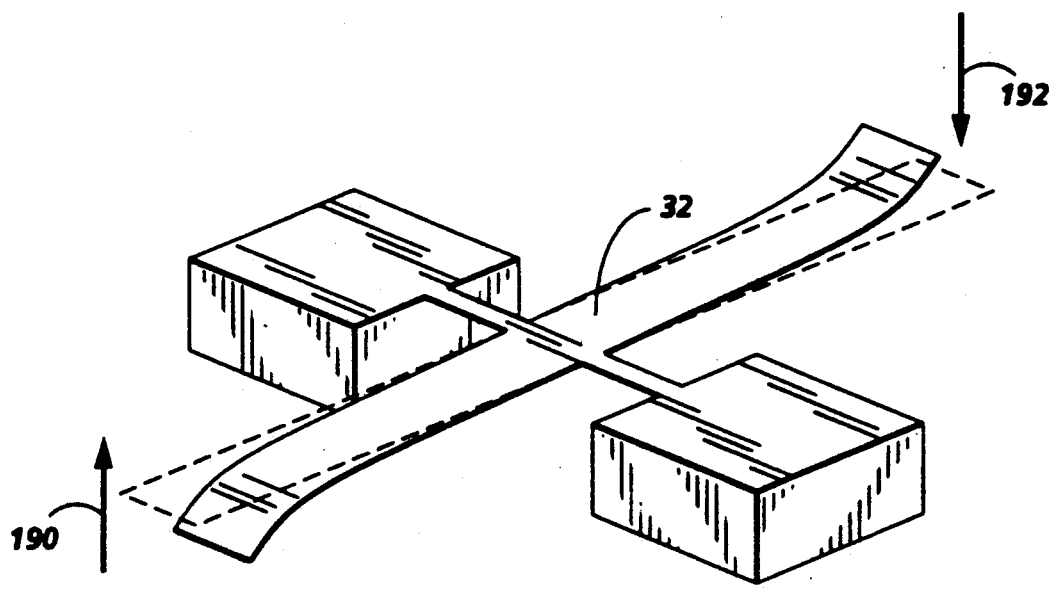

Referring finally to FIGS. 3A and 3B, which illustrate the two fundamental bending modes for the single balanced beam modulator, beam 32 may be operated in the symmetrical bending mode of FIG. 3A, or the asymmetrical mode of FIG. 3B. The bending mode of beam 32 is controlled using feedback from piezoelectric pickup 46, to regulate magnetic coil 38 to achieve the desired mode. Commonly known feedback techniques are employed to characterize the signal generated by piezoelectric pickup, 46, and, subsequently, to generate the signals which drive coil 38. In the symmetrical bending mode illustrated in FIG. 3A, the ends of the beam are generally traveling "in phase," or in the same direction at the same time. In the asymmetrical mode illustrated in FIG. 3B, the ends go in opposite directions as indicated by arrows 180 and 182. Since the symmetrical mode is less dependent on the mounting structure or accurate positioning of the supports, 36, at the center of the beam and since the resulting vibrational frequency is higher, oscillation of the beam in this mode is generally considered to be desirable.

In recapitulation, the present invention is a single balanced beam modulator suitable for use in a sensor assembly of an electrostatic voltmeter. The invention provides a highly efficient modulator as a result of the application of the single balanced beam design. The single beam design enables the increased separation of the driving and sensor signals which considerably reduces the undesirable cross-coupling of these signals. The invention further provides for the easy doubling of the modulation frequency by employing an arrangement where a sensor element is exposed to the external electrostatic field twice during each modulation cycle.

It is, therefore, apparent that there has been provided, in accordance with the present invention, an apparatus for efficiently modulating an electrostatic field sensor, thereby fully satisfying the aims and advantages hereinbefore set forth. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

I claim:

1. An apparatus for measuring the magnitude of an electrostatic field, comprising:
    a balanced beam vibratory element;
    means for resiliently supporting said balanced beam vibratory element;
    drive means for vibrating said balanced beam vibratory element; and
    an electrode, operatively associated with said balanced beam vibratory element, for sensing a capacitive coupling relationship with the electrostatic field and thereby producing a signal indicative of the magnitude of the electrostatic field during modulation of the coupling relationship.

2. The apparatus of claim 1 wherein the resilient support means supports the balanced beam vibratory element at a position in proximity to a vibrational node present at substantially about the midpoint of the element.

3. The apparatus of claim 1 wherein the electrode is attached to one end of the balanced beam vibratory element, so that the vibration of the element results in the oscillation of the electrode and modulation of the capacitive coupling relationship.

4. The apparatus of claim 1, wherein the electrode is postioned in a capacitive coupling relationship with an electrostatic field, and where the apparatus further comprises means, affixed to a first end of said vibratory element, for modulating the capacitive coupling relationship between the electrode and the electrostatic field.

5. The apparatus of claim 4, wherein the modulation means is an electrically conductive vane attached to the first of the balanced beam vibratory element, so that the vibration of the element results in the oscillation of the vane and the modulation of the capacitive coupling relationship between the electrode and the electrostatic field.

6. The apparatus of claim 1 wherein the drive means includes a magnetic coil disposed adjacent to one end of the balanced beam vibratory element so as to cause a deflection of the element upon activation of the coil.

7. The apparatus of claim 1 wherein the drive means includes a piezoelectric device operatively affixed to a surface of the balanced beam vibratory element so as to cause a deflection of the element in response to an electrical signal supplied to the device.

8. The apparatus of claim 1, including:
    means for sensing the vibrations of the balanced beam vibratory element and generating a signal in response thereto; and
    means, responsive to the signal generated by the vibration sensing means, for controlling the drive means so that the balanced beam vibratory element is caused to vibrate at a predetermined frequency.

9. The apparatus of claim 8 wherein the sensing means includes a magnetic coil disposed adjacent to one end of the balanced beam vibratory element, whereby the oscillation of the element induces an electrical signal from the coil in response to the presence of the end of the vibratory element.

10. The apparatus of claim 8 wherein the sensing means includes a piezoelectrically responsive film operatively affixed to one surface of the balanced beam vibratory element so as to produce an electrical signal in response to the deflection of the vibratory element.

11. The apparatus of claim 8, including:
    a housing enclosing the apparatus; and
    an aperture in the housing positioned so as to allow the electrode to become exposed to, and thereby coupled with, an external electrostatic field at least once during each cycle of the balanced beam vibratory element.

12. The apparatus of claim 1, wherein the drive means causes the vibration of the balanced beam vibratory element at a frequency of at least 1 kilohertz.

13. The apparatus of claim 3, further comprising amplifying means, affixed to the balanced beam vibratory element in close proximity to the electrode, for amplifying the signal produced by the electrode, and for outputting the signal to an electrostatic voltmeter.

* * * * *